United States Patent
Fryette et al.

(10) Patent No.: US 10,522,125 B2
(45) Date of Patent: Dec. 31, 2019

(54) MODULAR MUSICAL INSTRUMENT AMPLIFICATION SYSTEM WITH SELECTABLE INPUT GAIN STAGE RESPONSE BEHAVIOR

(71) Applicant: ETI SOUND SYSTEMS, INC., Huntington Park, CA (US)

(72) Inventors: Steven M. Fryette, North Hollywood, CA (US); Bruce Egnater, Oak Park, MI (US)

(73) Assignee: ETI SOUND SYSTEMS, INC., Huntington Park, CA (US)

( * ) Notice: Subject to any disclaimer, the term of this patent is extended or adjusted under 35 U.S.C. 154(b) by 0 days.

(21) Appl. No.: 15/759,767

(22) PCT Filed: Aug. 12, 2016

(86) PCT No.: PCT/US2016/046907
§ 371 (c)(1),
(2) Date: Mar. 13, 2018

(87) PCT Pub. No.: WO2017/027852
PCT Pub. Date: Feb. 16, 2017

(65) Prior Publication Data
US 2019/0051273 A1    Feb. 14, 2019

Related U.S. Application Data

(60) Provisional application No. 62/204,330, filed on Aug. 12, 2015.

(51) Int. Cl.
*H03G 3/00*    (2006.01)
*G10H 1/00*    (2006.01)
(Continued)

(52) U.S. Cl.
CPC ......... *G10H 1/0091* (2013.01); *G10H 1/348* (2013.01); *H03G 5/025* (2013.01); *H03G 5/14* (2013.01)

(58) Field of Classification Search
CPC ...... G10H 1/0091; G10H 1/348; H03G 5/025; H03G 5/14
(Continued)

(56) References Cited

U.S. PATENT DOCUMENTS

| 6,376,761 | B1 * | 4/2002 | LaMarra | G10H 1/02 381/118 |
| 2012/0192703 | A1 * | 8/2012 | Fuller | G10H 1/0091 84/746 |

* cited by examiner

*Primary Examiner* — Vivian C Chin
*Assistant Examiner* — Ammar T Hamid
(74) *Attorney, Agent, or Firm* — Lance M. Pritikin

(57) ABSTRACT

An exemplary modular musical instrument amplification system may comprise a chassis including a power supply, an input gain stage, a control processor and a plurality of modular slots. The modular slots are configured to receive any of a plurality of preamplifier modules for establishing an electrical communication therewith. The input gain stage has a modifiable response behavior and is in signal amplifying communication between at least one instrument input jack and the modular slots. The control processor is preferably in control communication between the modular slots and the input gain stage. Each preamplifier module has a respective input stage profile associated therewith. The control processor may be configured for sensing the input stage profile of a preamplifier module received in an active modular slot, and setting the response behavior based, at least in part, upon the respective input stage profile.

12 Claims, 7 Drawing Sheets

(51) Int. Cl.
  *G10H 1/34* (2006.01)
  *H03G 5/02* (2006.01)
  *H03G 5/14* (2006.01)
  *H03F 99/00* (2009.01)
(58) Field of Classification Search
  USPC .................................... 381/57, 58, 61, 120
  See application file for complete search history.

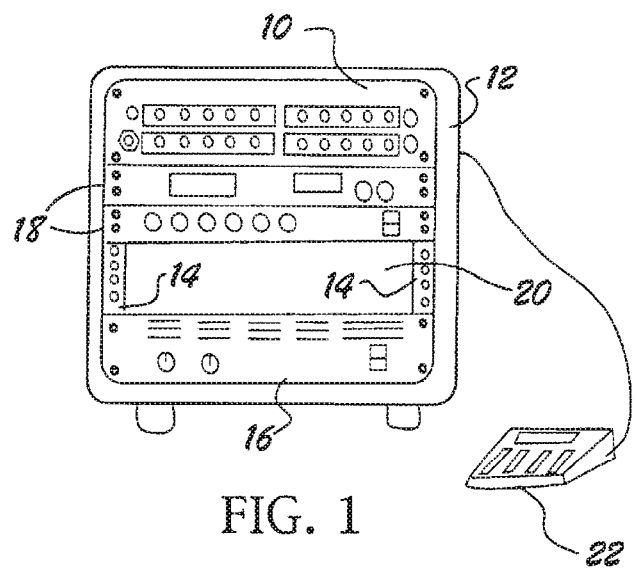
FIG. 1
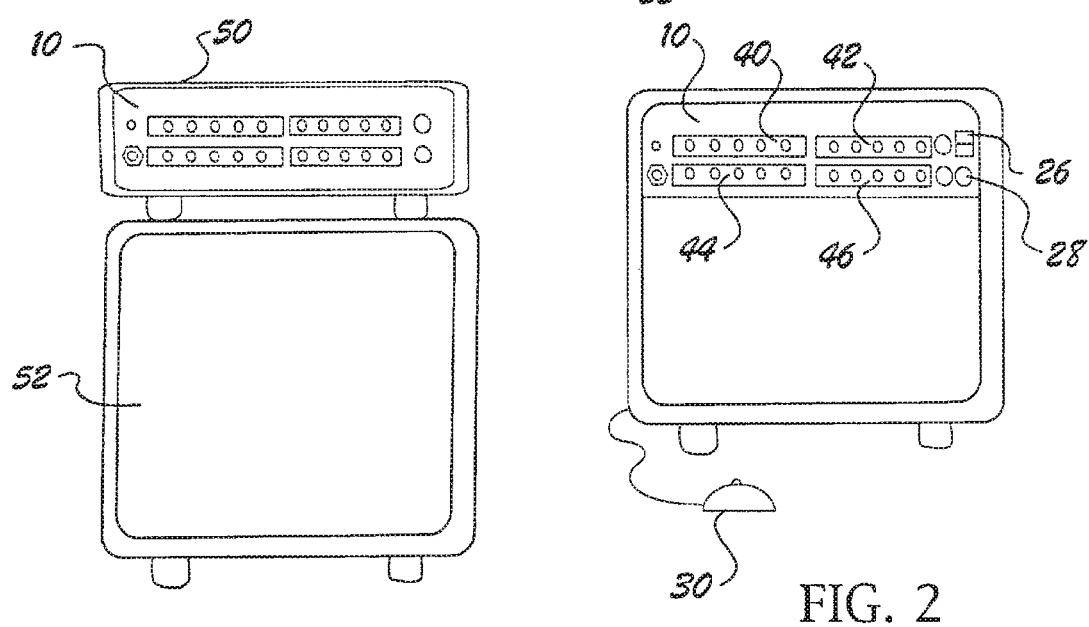
FIG. 3
FIG. 2

MODULAR MUSICAL INSTRUMENT AMPLIFICATION SYSTEM WITH SELECTABLE INPUT GAIN STAGE RESPONSE BEHAVIOR

RELATED APPLICATIONS

This application claims the benefit of U.S. Provisional Application No. 62/204,330 filed Aug. 12, 2015, the content of which is incorporated by this reference in its entirety for all purposes as if fully set forth herein.

TECHNICAL FIELD

The present invention relates generally to musical instrument amplifiers. More particularly, the invention relates to a modular musical instrument amplifier system that allows the musician to customize his or her amplifier by selecting and installing different modular pre-amplifier units or effect processor units.

BACKGROUND

Guitarists who play an electric guitar require an instrument amplifier in order to complete the guitar/amplifier system. This "system" is distinguished from a traditional amplifier system such as found in Hi-Fi or sound reinforcement applications in that the system imparts certain characteristics of its own which are considered desirable, even necessary, to the performance of the instrument to the extent that the guitarist (player) is intimately aware of a characteristic "feel" that exists in the response of a guitar amplifier. This "feel" is an important component in a guitar amplifier that can make the musician like or dislike the amplifier and is the result of numerous factors in the amplifier design— specifically tube amplifier design—including the transformers, parts used, tubes selected and numerous other factors.

One critical design element to achieve "feel" is the gain, distortion behavior and low frequency rolloff of the input gain stage amplifier. In a typical guitar amplifier, the rolloff is traditionally set at the first gain stage, commonly referred to as the V1 tube or tube stage. In addition, the bias current of the first stage is an important factor in the gain and sonic behavior of the stage and consequently the amplifier as a whole. In a Class A circuit such as commonly found in the V1 stage, Cathode Biasing is used to set the operating current. Setting the desired bias current and low frequency rolloff entails a combination of a capacitor and resistor connected to the cathode of the relevant V1 tube stage. The bias resistor also serves as the "R" in the R/C time constant equation which sets the low frequency rolloff curve. For example, to get the "Marshall" feel/sound a resistor value of 2.7K ohms and capacitor value of 0.68 microfarads is used. To get the "Fender" feel/sound, a resistor value of 1.5K ohms and capacitor value of 22 microfarads is used.

With reference to FIG. 9 for illustration, a number of bias resistor and rolloff capacitor component value combinations can be derived mathematically or empirically to create different or unique response curves. Over the years, different companies have derived specific combinations of these components in order to achieve their unique sound. Generally speaking, a higher rolloff frequency combined with a lower bias current of the input stage amplifier will yield a "tighter" feel and "smoother" response. This can be interpreted by the guitar player as having a more defined or clearer bass response as well as feeling more responsive or tighter/aggressive to the player. This type of response is generally preferred by musicians performing heavy rock and/or "metal" styles of music. Conversely, a lower rolloff frequency combined with a higher bias current will result in higher fidelity and would be considered "looser" or "fuller" by those skilled in the art. This can be interpreted by a guitarist as a more sluggish or "warmer/vintage" sort of tone which is desirable in many genres outside of heavy rock or metal. This characteristic low frequency rolloff is often crucial to feel and ultimately the satisfaction of the player.

The prior modular instrument amplification system of U.S. Pat. No. 6,376,761 ("the 761 patent") was introduced to offer players different characteristic and largely recognizable "sounds" by making the modules interchangeable. Many of the modules were intended to be replicates of the gain and sonic profiles of popular traditional amplifiers such as "Marshall," "Fender" and "Vox" to name a few. Its limitation however was that the bias and low frequency profile of the input gain stage was fixed in order to accommodate a variety of different module configurations. This represented a necessary, but less than optimum compromise. So while the preamp circuitry of each "module" of the '761 patent was different, the input stage behavior did not vary, creating a situation where all modules exhibited similar "feel" which is less desirable to discerning players.

SUMMARY

Certain deficiencies of the prior art may be overcome by the provision of one or more embodiments of a modular musical instrument amplification system with selectable input gain stage response behavior.

A modular musical instrument amplification system in accordance with the present disclosure may preferably comprise a chassis including a power supply, an input gain stage, a control processor and a plurality of modular slots. Each modular slot may be configured to receive any of a plurality of preamplifier modules for establishing an electrical communication therewith. The input gain stage may have a modifiable response behavior and be in signal amplifying communication between at least one instrument input jack and the modular slots. The control processor may be in control communication between the modular slots and the input gain stage. Each preamplifier module preferably has a respective input stage profile associated therewith. Moreover, the control processor is preferably configured for sensing the input stage profile of a preamplifier module received in an active modular slot, and setting the response behavior based, at least in part, upon the input stage profile.

At least one of the input stage profiles may be selectively adjustable by a person operating or servicing said system, and the selective adjustability may be by way of a multi-position switch, potentiometer or the like. Such multi-position switch or potentiometer may preferably be located on the respective preamplifier module or the chassis.

The setting of the response behavior may be by way of switching between discrete combinations of bias resistors and rolloff capacitors connected to a cathode of the input gain stage.

BRIEF DESCRIPTION OF THE DRAWINGS

Further advantages of the present invention may become apparent to those skilled in the art with the benefit of the following detailed description of the preferred embodiments and upon reference to the accompanying drawings in which:

FIG. 1 is a front view of a first embodiment of the modular amplification system, adapted for use in a rack mount configuration;

FIG. 2 is a front view of the modular amplification system, adapted for use in an integrated musical instrument amplifier;

FIG. 3 is a front view of the modular amplification system, adapted for use in a combo amplification system comprising an amplifier head and separate speaker enclosure;

BACKGROUND AND DETAILED DESCRIPTION

Figure 4:
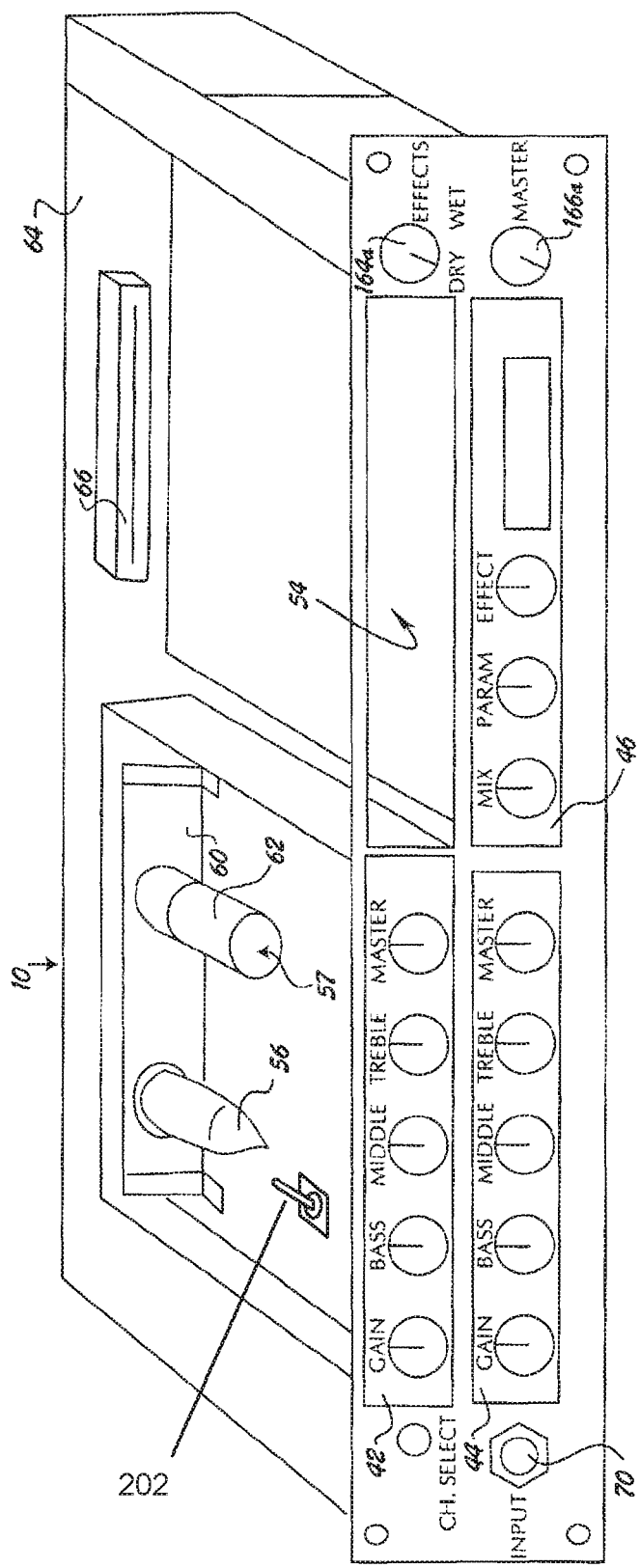
FIG. 4 is a front perspective view of one non-limiting embodiment of the amplification system, with top cover removed to show the internal configuration.

Referring now to the drawings, like reference numerals designate identical or corresponding features throughout the several views.

Figure 9:
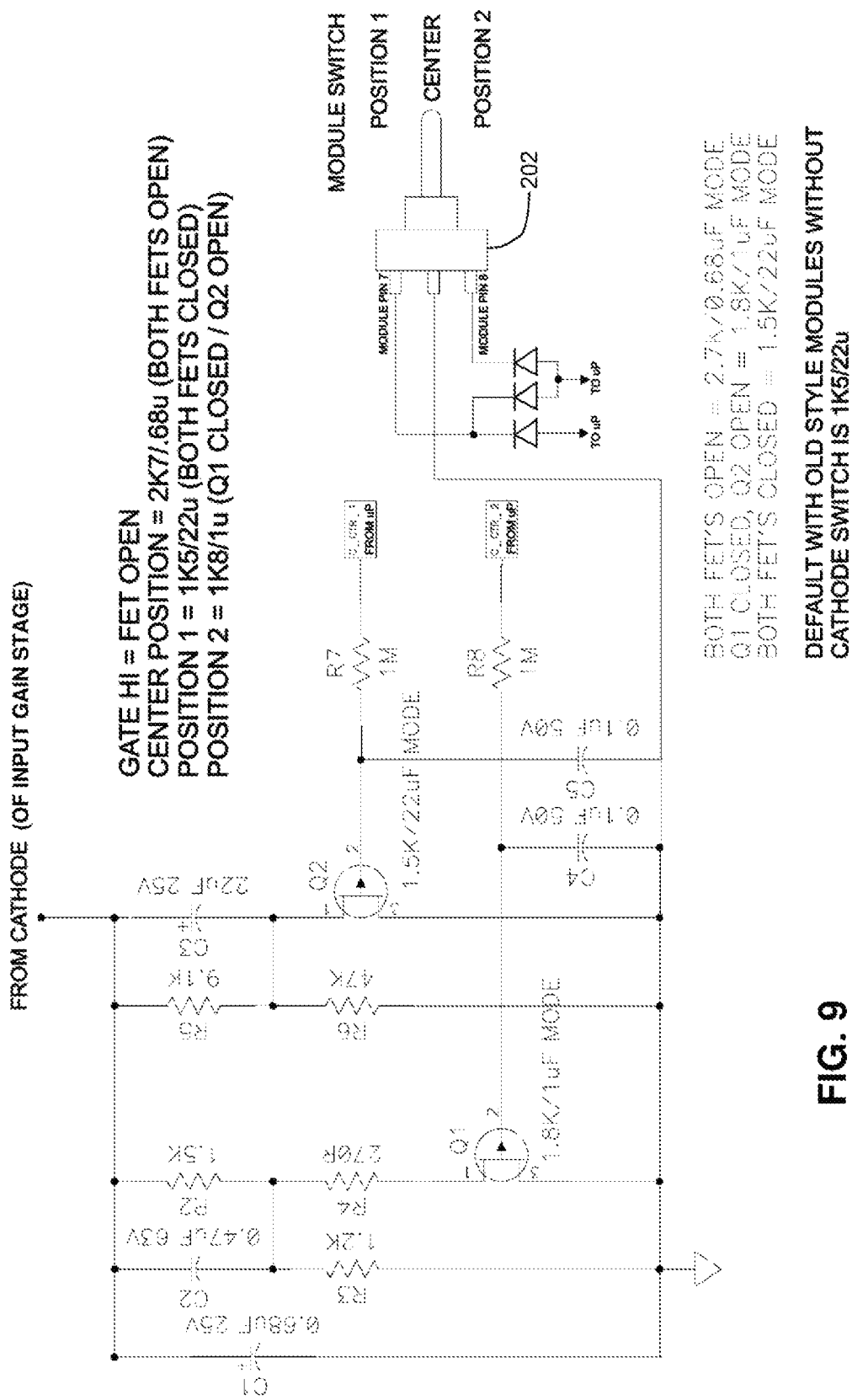
FIG. 9 is a schematic of aspects of an example improved modular amplification system, showing example additional circuitry for adjusting the response behavior of the input gain stage, and an example multi-position input stage profile switch mounted on a module.
Figure 10:
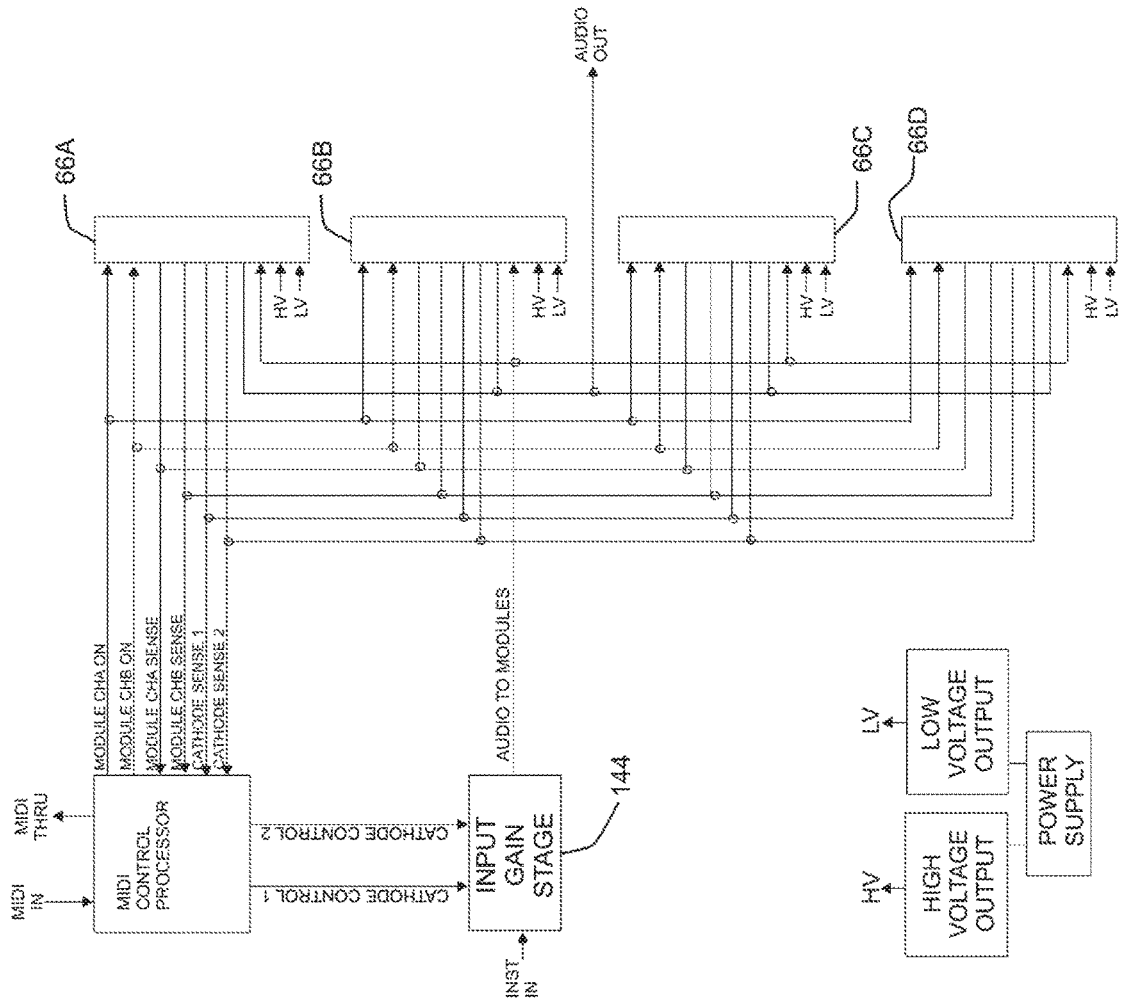
FIG. 10 is a block diagram of a chassis of an improved modular amplification system in accordance with a non-limiting embodiment of the present invention.

Preferred systems in accordance with the present invention make the input stage profile of the modular amplification system user-selectable, and/or specifically assignable to a given sound module. Referring to FIG. 9 for example, this may be accomplished by way of additional circuitry added to the cathode of the input gain stage 144 which allows different combinations of resistors and capacitors to be selected within each module via, for example, a module board mounted switch 202.

In particular embodiments of the presently-described system, depending on the position of the module mounted profile selector switch 202, each module, in conjunction with the programmed response management code in the microprocessor, determines the required response behavior in the V1 stage 144 and sets the input stage values accordingly. In operation of one particular embodiment of a system described herein, the microprocessor senses the position of the three position profile selector switch when a particular module slot is activated and correspondingly outputs the appropriate signals to the microprocessor. This, in turn, modifies the behavior of input stage via FETs, which serve as voltage translators to determine which combination of cathode components are active in the input gain amplifier. In alternate embodiments of the system, the FETs can be substituted with relays, mechanical switches or any other suitable switching device.

Incorporating the novel improvements described herein achieves the goal of extending significantly, the utility and familiarity of the modules individually, and consequently the system as a whole, providing the player new flexibility that has not been offered previously.

FIGS. 1, 2 and 3 illustrate aspects of three different potential physical embodiments of the modular amplification system. In FIG. 1, the modular amplification system 10 is shown in a rack mount configuration. The configuration includes a rack mount shell 12 having rails 14 to which rack mount units are attached with screws or bolts. For illustration purposes, the rack mount configuration of FIG. 1 also illustrates a power amplifier 16 and two outboard effects processors 18 secured within the rack. The empty space 20 above power amplifier 16 represents available space for additional rack mount units. In this configuration, the output of the modular amplification system would be fed to the input of power amplifier 16 and the output of power amplifier 16 would be fed to a suitable speaker enclosure (not shown).

The preferred embodiment of the modular amplification system may be designed to work with a variety of different foot pedals, as will be more fully described below. Illustrated in FIG. 1 is a MIDI foot pedal 22 that allows the musician to control operation of the modular amplification system by pressing selected buttons on the foot pedal. Pressing the appropriate footswitch button, the musician selects which preamplifier will be used.

The integrated amplifier embodiment of FIG. 2 includes the modular amplification system in the upper portion of the amplifier enclosure, as illustrated. The integrated amplifier may have a self-contained power amplifier and a speaker or speakers. The speakers may be disposed behind a grill 24 and the power amplifier may be integrated with or attached to the modular amplification system. For illustration purposes, a front panel on/off switch 26 and an additional power amplifier gain control knob 28 are illustrated. Although not required, these additional controls may be desired in some configurations.

The integrated amplifier system illustrated in FIG. 2 includes a simple on/off push-button switch 30 that is connected through an input on the rear panel of the modular amplification system. By momentarily pressing switch 30, the musician is able to control the operation of the modular amplification system. More specifically, the presently preferred embodiment of the amplification system allows the musician to install up to four modular pre-amplification units or modular effects processor units. These four units are shown at 40, 42, 44, and 46 in FIG. 2. By momentarily activating the push-button switch 30, the musician can cycle from one pre-amplification unit to the next, thereby instantly changing which preamplifier will be used.

FIG. 3 illustrates a third embodiment of the modular amplification system 10, in which the amplification system is mounted in a separate head unit 50 that sits atop the speaker enclosure cabinet 52. Aside from having the amplifier section and speaker enclosure section disposed in separate cabinets, the basic configuration of the embodiment of FIG. 3 is electronically the same as the embodiment of FIG. 2.

The modular amplification system 10 is shown in greater detail in FIG. 4. Specifically, a rack mount embodiment is illustrated in FIG. 4. It will, of course, be understood that the other embodiments would similarly fabricated. In the embodiment illustrated in FIG. 4 the top panel of the amplifier system has been removed to reveal the internal components. In addition, the top cover of pre-amplifier module 42 has also been removed to reveal the internal components of that unit, including switch 202 by which the input stage profile associated with the respective module may be selectively adjusted. Further note that no pre-amplifier unit (module) is shown installed in the upper right-hand corner, thereby revealing one of the elongated slotted openings 54.

Each slotted opening may be sized to receive a modular unit similar to those shown at 42, 44, and 46. In the illustrated embodiment, modular units 42 and 44 are pre-amplifier units having Gain, Bass, Middle, Treble and Master control knobs. Module 46 is a digital signal processor unit. The slotted opening 54 may be filled with a screw-in or snap-in protective cover when no modular unit is installed. The same is true for the other locations.

The musician generally has complete flexibility as to which pre-amplifier modules to insert into which of the four locations. In one embodiment, one of the four slotted openings is designated to receive either a pre-amplifier module or an effects processor module. In FIG. 4 the lower right-hand slotted opening (carrying module 46) is designated for this dual function. Of course, any of the four slotted openings could be designed to provide the dual function capability.

In an alternate embodiment, circuitry is configured to accept either a pre-amplifier module or a signal processing module at any of the four locations. In this alternate embodiment, the respective circuitry senses which type of module has been installed and routes the audio signals appropriately. Thus a signal processing module is inserted in series with the selected pre-amplifier module or modules, so that the signal processing effects are available for use regardless of which pre-amplifier module the musician has selected.

The pre-amplifier modules can be based on either solid state or vacuum tube design. Many vintage amplifiers employ vacuum tube circuitry, and a large number of musicians still prefer vacuum tube circuitry for the warm distortion that this circuitry provides. Pre-amplifier module 42 thus illustrates how vacuum tube circuitry may be incorporated into the modular packaging. Pre-amplifier module 42 employs two vacuum tubes 56 and 57 that are attached with tube sockets to a stand-off circuit board 60. To minimize hum, the vacuum tubes may be shielded with a suitable cylindrical metal shield as at 62. The shield has been removed from vacuum tube 56 to reveal the vacuum tube.

Figure 5:
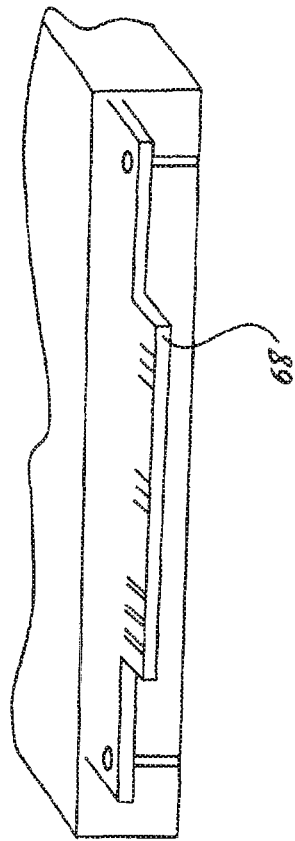
FIG. 5 is a partial perspective view of the rear of one of the modular preamplifier units (preamplifier modules), illustrating the edge connector.

The modular pre-amplifier units (and effects processors units) may preferably attach to the chassis 64 of the modular amplification system 10 using edge connectors. The edge connector associated with slotted opening 54 is shown at 66. The edge connector is designed to receive the posterior edge of the circuit board associated with a modular unit, so that the appropriate circuit board traces make contact with the edge connector 66 (thus establishing electrical communication between the module and the chassis). Although edge connectors are presently preferred, other suitable multi-pin connectors may be used. Such connectors include, but are not limited to, multi-pin header connectors, ribbon connectors and the like. FIG. 5 shows how the circuit board of a modular unit may be provided with a male edge portion 68 that will insert into the female edge connector 66.

The edge connector supplies power to the modular units and also makes appropriate contact for sending and receiving the audio signals and any necessary data or control signals. Preferably the edge connector is wired so that certain contacts are assigned to certain functions (such as power supply functions, audio signal functions, MIDI data functions, on/off functions, input stage profile sensing and the like).

Typically a vacuum tube circuit will require a low voltage (e.g. 6 volts or 12 volts) to supply the vacuum tube heaters and a high voltage (e.g. 300 volts DC) to supply the vacuum tube plate and other associated biasing circuitry. A transistor pre-amplifier unit or digital signal processing unit may require other voltages as well. All of these voltages are preferably generated by a common power supply using suitable voltage regulators to supply the needed voltages. A digital device, such as a signal processing unit or a transistorized pre-amplifier device would not require the same voltages as the vacuum tube devices and hence would not make contact with the edge connector contacts carrying those higher voltages. Alternatively, each individual module can have its own voltage regulator circuitry to convert the supply voltages to the proper voltages required.

The pre-amplifier circuits and the digital signal processing circuits typically include at least one audio input and at least one audio output. These inputs and outputs are also provided at the appropriate edge connector terminals. If desired, the edge connectors can be configured so that digital signal processing units are inserted in the audio signal chain (in series with a pre-amplifier). This may be done by assigning certain contacts of the edge connector to the signal insert function. Other contacts used by the pre-amplifier units would connect the input and output of the pre-amplifier with the input and output of the modular amplification system. For more details on signal routing, refer to the circuits description below.

Pre-amplifier units based on vintage amplifier designs typically have fairly simple feature switching requirements. For example, a vintage pre-amplifier circuit may employ a signal push button switch to engage or disengage a "Bright" toggle switch, or to select between "Rhythm" and "Lead" channels. The switching signals to control these features may be supplied by a simple momentary push-button switch which is connected through suitable contacts on the edge connector. More sophisticated digital modeling amplifiers and digital signal processing units typically require more complex control mechanisms. The presently preferred embodiment supports MIDI control. MIDI control signals are supplied over suitable contacts of the edge connector to devices that utilize MIDI signals. In this way, a MIDI foot pedal can be used to change modeling amplifier characteristics or digital signal processing characteristics either between songs or as the musician is playing.

The modular amplification system is designed with flexibility in mind. Thus, the musician can select the pre-amplifier units of choice (and also the digital signal processing units of choice) and conveniently insert them into the slots provided on the front panel of system 10. Each modular unit provides its own potentiometer controls and switches that are used to control the basic pre-amplifier functions (or digital signal processing functions, as the case may be). Although the pre-amplifier units illustrated in FIG. 4 have the identical configuration: Gain, Bass, Middle, Treble, Master, the illustration is not intended as a limitation. Rather, the pre-amplifier units can have any configuration as desired to provide the functionality of the amplifier it is designed to emulate. Moreover, the multi-position switch or potentiometer 202 may preferably be placed directly on the face of the respective module, rather than on the circuit board housed therein After the musician has inserted the pre-amplifier units of choice into the system 10, the amplifier is ready for use. The musician plugs a musical instrument into input jack 70 and the audio input signal is automatically routed to whichever pre-amplifier unit is currently active. The active pre-amplifier unit may be selected by depressing the channel select button 72 on the front panel or by using a foot switch. Each time the button is pressed, the system steps to the next pre-amplifier unit installed. Any empty slots are simply skipped as the channel select button is pressed. The position of the switch or potentiometer 202 may be set prior to insertion of the module into the slot of the chassis, or during use of the system if the switch or potentiometer 202 is located on the face of the module. Its adjustment allows the user to modify the response behavior of the input gain stage.

Figure 6:
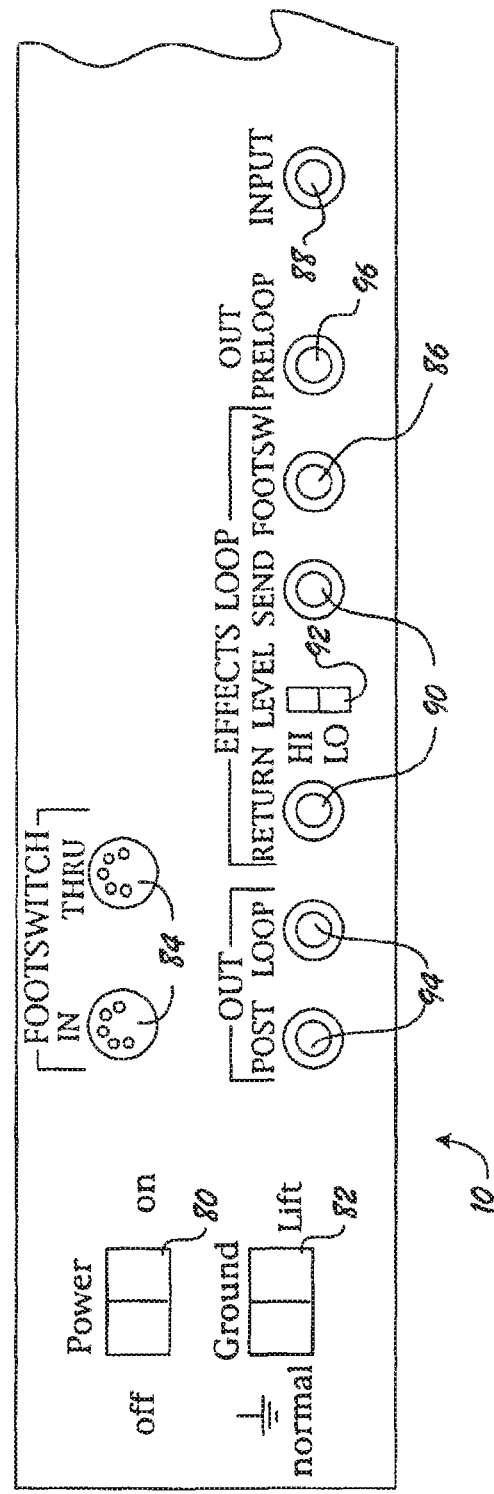
FIG. 6 is a partial rear view of one non-limiting embodiment of the modular amplification system, illustrating one preferred rear panel layout.

The modular amplification system 10 is preferably provided with an assortment of output jacks on the rear panel, as illustrated in FIG. 6. In this regard, FIG. 6 illustrates one possible embodiment. Depending on the actual implementation (rack mount, integrated amplifier, combo amplifier). The rear panel configuration may differ.

Referring to FIG. 6, the power switch 80 turns the modular amplification system on and off, while the ground lift switch 82 disconnects the ground associated with the audio signal path. The ground lift switch is thus used to eliminate ground loops that are sometimes encountered. Ground loops are caused when two or more pieces of audio equipment are connected through plural ground connections producing an undesirable buzz or hum in the audio output.

MIDI Input and Thru jacks are provided at 84 for connection of a MIDI control pedal such as pedal 22. The more simple push button switch (such as push button 30) (FIG. 2) is connected to foot switch input jack 86. Although the preferred embodiment provides an input jack 70 on the front panel (FIG. 4), an additional input jack may be provided as at 88 on the rear panel (FIG. 6).

The remaining inputs and outputs featured on the back panel may be used to connect to power amplifiers (such as amplifier 16 of FIG. 1) or to other outboard effects processors (such as processors 18 of FIG. 1). The preferred embodiment is designed to send and receive audio signals to an effects loop. Thus suitable send and return jacks 90 are provided. Because consumer grade and commercial grade effects processors may have different input signal level requirements, a HI/LO toggle switch 92 is provided in the effects loop. The musician can switch this toggle switch to match the signal requirements of the outboard signal processing equipment he or she is using.

The modular amplification system is able to supply output signals that are derived either after the effects loop or before the effects loop. The output jacks 94 are "post loop" and thus provide an audio output signal that is affected by any devices attached into the effects loop. Output 96 is "preloop" and thus provides a dry signal (not affected by the effects loop).

Figure 7:
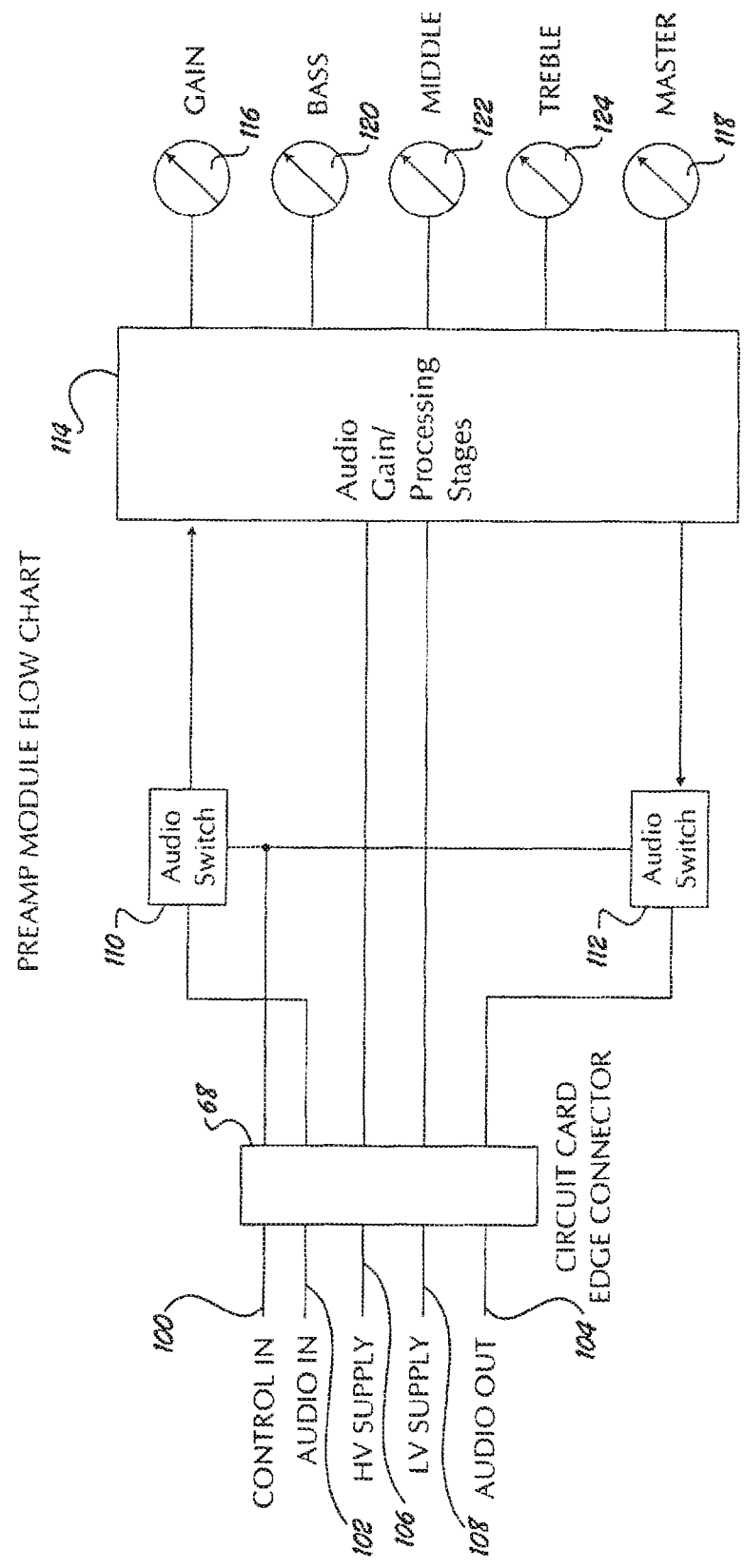
FIG. 7 is a block diagram of a conventional modular preamplifier unit (preamplifier module), some or all aspects of which may be incorporated into a preamplifier module in accordance with one embodiment of the present invention.

Turning now to the circuit diagrams of FIGS. 7 and 8, a further explanation of certain preferred signal routing circuitry will now be described. Referring to FIG. 7, an exemplary pre-amplifier module in accordance with the invention derives a plurality of input signals (fed to edge card connector 68) from the modular amplifier system chassis. In the presently preferred vacuum tube pre-amplifier circuit, those input signals include, a control input signal on lead 100, and audio input signal on lead 102, and audio output signal on lead 104 and high and low power supply voltages on leads 106 and 108, respectively.

The input and output signals are fed through audio switches 110 and 112 that are activated by a logic signal on control input lead 100. When the pre-amplifier module is switched into operation, a control signal on lead 100 closes switches 110 and 112, causing the audio input signal to be fed into the gain processing stages 114 via switch 110. The same control signal also switches audio switch 112 into conduction, thereby feeding the output of the gain processing stages 114 to the audio output lead 104.

The audio gain and processing stages have suitable potentiometer controls to adjust the amplifier gain and tone. More specifically, the preferred embodiment provides both input and output gain controls, designated as gain control 116 and master control 118. In many popular pre-amplifier circuits, it is common to provide both gain and master gain controls, so that the pre-amp stage can be overdriven while still maintaining a moderate volume level. The preferred tone control section includes a Bass control 120, a Mid-range control 122 and a Treble control 124.

Note that the audio switches 110 and 112 isolate both the input and the output of the audio gain and processing stages 14. This is done to reduce crosstalk and noise that might otherwise occur due to the close proximity of the pre-amplifier sections within the chassis.

Figure 8:
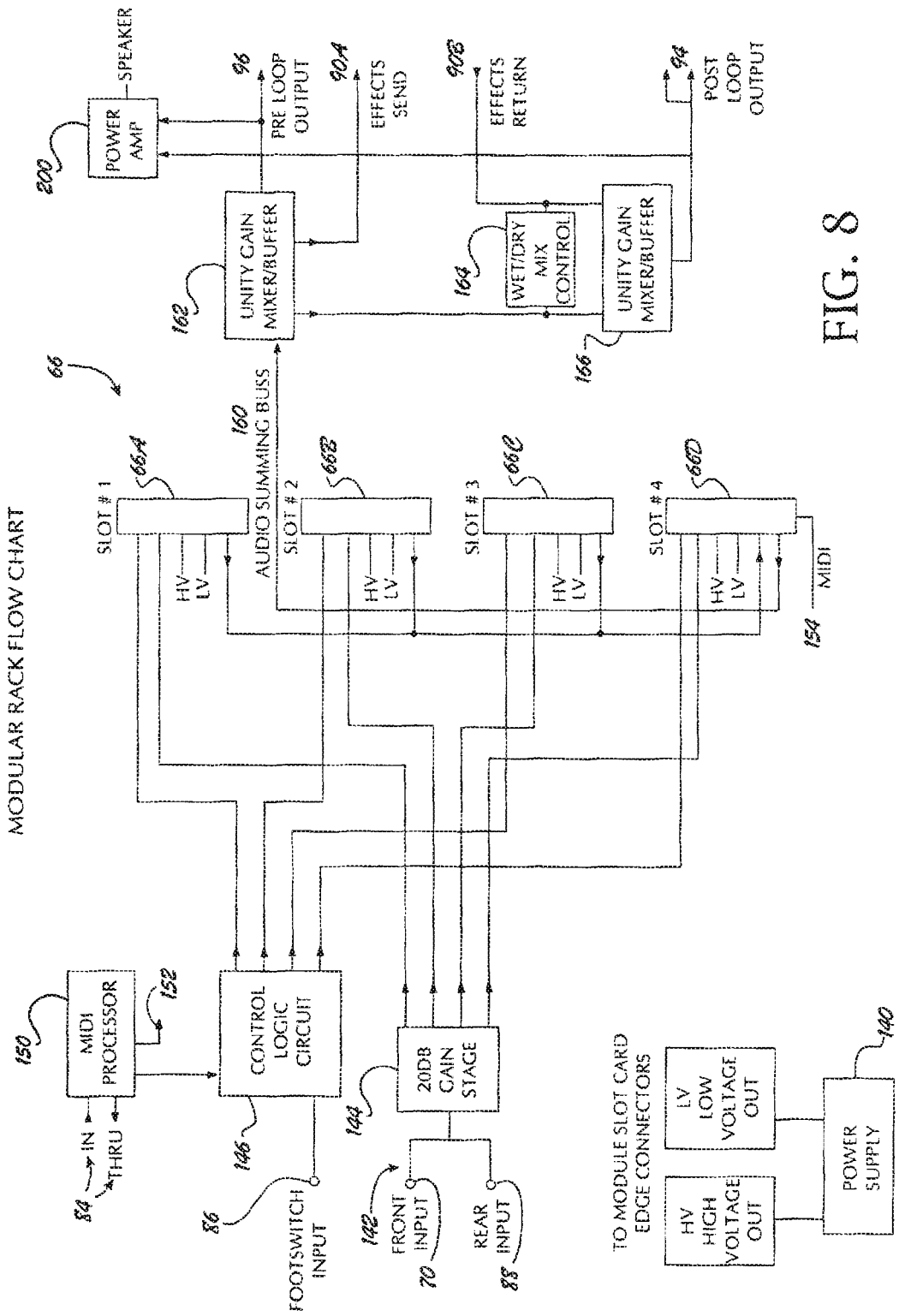
FIG. 8 is a block diagram of chassis components of a conventional modular amplification system, some or all of which may be incorporated into an improved modular amplification system described herein.

The circuitry associated with chassis 64 is illustrated in FIG. 8. The power supply 140 supplies both high voltage (HV) and low voltage (LV) power that are respectively supplied to the HV and LV pins of the edge connectors 66. In FIG. 8 the individual edge connectors associated with the four slotted openings have been further designated 66 a-d. In the illustrated embodiment, the fourth slot (associated with edge connector 66 d) serves a dual purpose. It can accommodate either a pre-amplifier module or an effects processor module.

The audio input signal is fed as illustrated at 142 from both the front input jack 70 and the rear input jack 88 through a 20 db gain stage 144. This gain stage, in turn, feeds the four edge connectors with the audio input signal.

The control logic circuit 146, which may be connected to the foot switch input 86 and also to the MIDI processor 150. MIDI processor 150 receives MIDI input signals on the MIDI input jack 84, decodes those signals, and supplies a control logic signal to the control logic circuit 146. This way either the simple push button foot switch or a MIDI control foot switch can provide switching instructions to the control logic circuit 146.

The control logic circuit, in turn, supplies control input signals to the edge connectors 66 to be supplied to the modules that are plugged into the respective edge connectors. If desired, the MIDI processor 150 can supply an additional MIDI signal on lead 152, which may be routed to an appropriate terminal on the edge connector. In this regard, edge connector 66 d includes pin 154 that supplies the MIDI control signal. This control signal may be used to change the settings of a MIDI device plugged into that slot. Although only edge connector 66 d is illustrated with the MIDI signal present, it will be apparent that the MIDI signal can be supplied to all edge connectors, if desired.

Each of the edge connectors 66 provides an audio output terminal that routes the audio signal over an audio summing bus 160 to the unity gain mixer/buffer amplifier 162. This buffer amplifier, in turn, supplies the audio output signal to the effects send jack 90 a and to the pre loop output jack 96. The effects return jack 90 b couples the effects return signal through a wet/dry mix control 164 that is used to blend the amount of the effects processed signal with the dry or unprocessed signal. The wet/dry mix control 164 is provided with a suitable control knob illustrated in FIG. 4 at 164 a. The mix control supplies output signals to the unity gain mixer/buffer 166, which in turn provides the post loop output signal to jack 94. The unity gain mixer/buffer amplifiers 162 and 166 are preferably provided with a level control knob (shown in FIG. 4 at 166 *a*). This control knob adjusts the overall master gain to control the level of the signal present on all of the output jacks.

Although it is not necessary to provide a power amplifier stage on chassis 64, such a stage can be added if desired. In FIG. 8 the power amplifier is shown at 200. It receives input signals from the unity gain mixer/buffer amplifiers 162 and 166 and supplies an output to a suitable speaker cabinet. The power amplifier 200 can be mono, stereo or more channels, as desired.

Preferred embodiments of a modular musical instrument amplification system in accordance with the present disclosure may comprise a chassis 64 including a power supply 140, an input gain stage 144, a control processor and a plurality of modular slots (for example, 66A-66D). The modular slots may be configured to receive any of a plurality of preamplifier modules (such as, for example, those depicted in FIGS. 5 and 7) for establishing an electrical communication therewith. The input gain stage 144 may have a modifiable response behavior and be in signal amplifying communication between at least one instrument input jack 70 and the modular slots. The control processor may be in control communication between the modular slots and the input gain stage 144. Each preamplifier module may have a respective input stage profile associated therewith. The control processor may be configured for (i) sensing the input stage profile of a preamplifier module received in an active modular slot, and (ii) setting the response behavior based, at least in part, upon the input stage profile. The system may preferably comprise at least two preamplifier modules. The chassis 64 may be adapted to be secured to a pair of mounting rails.

In certain preferred embodiments of the systems described herein, at least one input stage profile is selectively adjustable by a person operating or servicing said system. The selective adjustability may be by way of, for example, a multi-position switch 202, a potentiometer or the like. Such switch or potentiometer may be located on the respective preamplifier module or on the chassis.

In particular preferred embodiments of a system described herein, at least one of the preamplifier modules may have amplification and sound coloration properties not shared by at least one of the other of the preamplifier modules.

Each of the modular slots may include a first connector 66, and each of the preamplifier modules may include a second connector 68 for engagement with one of the first connectors when the preamplifier module is received by one of the modular slots. The aforementioned electrical communication may be configured to occur by way of respectively engaged first and second connectors.

Setting of the response behavior may be by way of switching between discrete combinations of bias resistors and rolloff capacitors connected to a cathode of said input gain stage.

An integrated musical instrument amplifier may have a power amplifier and at least one speaker disposed in a common cabinet. Such instrument amplifier may further comprise an embodiment of the modular musical instrumentation amplification system disclosed herein, wherein the system is disposed in the common cabinet and is coupled to the power amplifier.

A musical instrument combo amplifier head may comprise a power amplifier disposed in a first cabinet. The power amplifier may have at least one output terminal for coupling to at least one speaker external from the first cabinet. Such combo amplified may further comprise an embodiment of the modular musical instrumentation amplification system disclosed herein. Wherein the system is disposed in the first cabinet and is coupled to the power amplifier.

From the foregoing it will be appreciated that the modular amplification system of the invention provides a great deal of flexibility and versatility. In addition to allowing the musician to effectively build a custom musical instrument amplifier having a variety of different performance characteristics without the need to purchase multiple complete amplifier systems, the input gain stage of the system chassis is also configurable to allow optimization or selection of the desired response behavior. The invention thus helps the musician enhance his or her playing styles and musical opportunities without unduly taxing the budget.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A modular musical instrument amplification system comprising:
    a chassis including a power supply, an input gain stage, a control processor and a plurality of modular slots, each said modular slot being configured to receive any of a plurality of preamplifier modules for establishing an electrical communication therewith, said input gain stage having a modifiable response behavior and being in signal amplifying communication between at least one instrument input jack and said modular slots, said control processor being in control communication between said modular slots and said input gain stage;
    wherein each said preamplifier module has a respective input stage profile associated therewith, and said control processor is configured for
        (i) sensing said input stage profile of a said preamplifier module received in an active said modular slot, and
        (ii) setting said response behavior based, at least in part, upon said input stage profile.

2. A system as defined in claim 1 in which at least one said input stage profile is selectively adjustable by a person operating or servicing said system.

3. A system as defined in claim 2 in which said selective adjustability is by way of a multi-position switch or potentiometer.

4. A system as defined in claim 3 in which said switch or potentiometer is located on the respective preamplifier module.

5. A system as defined in claim 3 in which said switch or potentiometer is located on the chassis.

6. A system as defined in claim 1 in which at least one of said preamplifier modules has amplification and sound coloration properties not shared by at least one of the other of said preamplifier modules.

7. A system as defined in claim 1 in which each of said modular slots includes a first connector, and each of the preamplifier modules includes a second connector for engagement with one of said first connectors when said preamplifier module is received by one of said modular slots;
    wherein said electrical communication is configured to occur by way of respectively engaged first and second connectors.

8. A system as defined in claim 1 in which said setting is by way of switching between discrete combinations of bias resistors and rolloff capacitors connected to a cathode of said input gain stage.

9. A system as defined in claim 1 further comprising at least two said preamplifier modules.

10. A system as defined in claim 1 in which said chassis is adapted to be secured to a pair of mounting rails.

11. An integrated musical instrument amplifier having a power amplifier and at least one speaker disposed in a common cabinet, and further comprising the modular musical instrumentation amplification system according to claim 1, said system being disposed in said common cabinet and being coupled to said power amplifier.

12. A musical instrument combo amplifier head comprising a power amplifier disposed in a first cabinet, said power amplifier having at least one output terminal for coupling to at least one speaker external from said first cabinet; and further comprising the modular musical instrumentation amplification system according to claim 1, said system being disposed in said first cabinet and being coupled to said power amplifier.

\* \* \* \* \*